United States Patent [19]

Shwartzman et al.

[11] Patent Number: 4,818,334

[45] Date of Patent: Apr. 4, 1989

[54] METHOD OF ETCHING A LAYER INCLUDING POLYSILICON

[75] Inventors: Stanley Shwartzman, Somerville Borough; Michael F. Leahy, East Brunswick Township, Middlesex County, both of N.J.

[73] Assignee: General Electric Company, Somerville, N.J.

[21] Appl. No.: 168,465

[22] Filed: Mar. 15, 1988

[51] Int. Cl.[4] .................. H01L 21/306; B44C 1/22
[52] U.S. Cl. .................... 156/643; 156/646; 156/651; 156/657; 156/659.1; 156/662; 204/192.37; 252/79.1; 437/191; 437/233; 357/59
[58] Field of Search ............... 156/643, 646, 651, 657, 156/659.1, 661.1, 662; 204/192.37; 427/38, 39; 252/79.1; 437/186, 191–193, 228, 233; 357/59, 71

[56] References Cited

U.S. PATENT DOCUMENTS

| | | | |
|---|---|---|---|
| 4,341,594 | 7/1982 | Carlson et al. | 156/643 |
| 4,460,435 | 7/1984 | Maa | 156/643 |
| 4,584,055 | 4/1986 | Kayanuma et al. | 156/628 |
| 4,717,448 | 1/1988 | Cox et al. | 156/651 X |

OTHER PUBLICATIONS

"Plasma Processes For Megabit Memory Manufacturing and Some Thoughts on Plasma Damage", by G. K. Herb, et al. Plasma Seminar Proceedings, 13th Edition, May 18, 1987.

*Primary Examiner*—William A. Powell
*Attorney, Agent, or Firm*—K. R. Glick; B. E. Morris

[57] ABSTRACT

The present invention relates to a method of forming gate lines of polycrystalline silicon, polysilicon, which may have a layer of a metal silicide thereon. The gate lines are formed over islands of silicon on an insulating substrate with the islands being covered with a layer of silicon oxide. A polysilicon layer is coated over the silicon oxide layer on the silicon island and on the adjacent surface of the substrate. Resist masking strips are formed over the area of the polysilicon layer which are to form the gate lines. The exposed area of the polysilicon layer is first plasma etched in a gaseous mixture of nitrogen, chlorine and chloroform. The chlorine etches the polysilicon and the chloroform forms a protective coating of a polymer over the side walls of the formed gate lines. The device is then subjected to a second plasma etch in a gaseous mixture of helium, chlorine and carbon dioxide. The chlorine etches away any polysilicon stringers which may extend between the gate lines along the side walls of the silicon island. The carbon dioxide provides oxygen to maintain the silicon oxide layer on the islands and carbon to maintain the polymer. Thus, any stringers which could short out the gate lines are removed without undercutting the gate lines and without removing the silicon oxide layer.

15 Claims, 2 Drawing Sheets

METHOD OF ETCHING A LAYER INCLUDING POLYSILICON

FIELD OF THE INVENTION

The present invention relates to a method of plasma etching a layer which includes polysilicon, polycrystalline silicon. More particularly, the present invention relates to a method of plasma etching a layer which includes polysilicon which is on islands of silicon without leaving stringers of the polysilicon.

BACKGROUND OF THE INVENTION

Silicon-on-insulator (SOI) integrated circuits include a plurality of islands of single crystalline silicon on a substrate of an insulating material, such as sapphire. Semiconductor devices, such as insulated gate field effect transistors (IGFETS) are formed in the silicon islands. Such IGFETS include a thin layer of silicon oxide over the silicon islands and gate lines of a conductive material extending across the islands and over the oxide layer. The gate lines are generally formed of conductive polycrystalline silicon, and, to make them more conductive, are often covered with a layer of a metal silicide, such as tantalum or titanium silicide. This bilayered structure is called a polycide.

To make the SOI integrated circuits, the silicon islands are first formed on the insulating substrate. The islands are then heated in an oxidizing atmosphere to form a thin layer of silicon oxide over the entire surface of the islands. A layer of polysilicon is then deposited over the entire surface of the islands and the exposed surface of the substrate. If silicide is used, it is deposited over the polysilicon layer, such as by co-sputtering the metal and silicon or by sputtering the metal and heating to convert a surface portion of the polysilicon to the silicide. The polysilicon layer, with or without the silicide layer, is then defined to form the gate lines extending over the islands. This is achieved by covering the polysilicon layer with a layer of a photoresist which is defined, using standard photolithographic techniques, to cover only the portions of the polysilicon layer which are to form the gate lines. The exposed area of the polysilicon layer is then removed leaving the gate lines. The exposed area of the polysilicon layer is generally removed by etching, usually with an anisotropic etch, such as by plasma etching.

A problem with this technique of etching the polysilicon layer is that it leaves narrow strips of the polysilicon, known as stringers, along the side walls of the silicon islands. If there are two or more gate lines being formed over a silicon island, the stringers can electrically connect such gate lines and short them to each other. To completely remove such stringers requires a long overetch. However, such long overetching is not acceptable since it will also remove the exposed silicon oxide, which is undesirable. Therefore, it would be desirable to have a plasma etching technique which would remove all of the polysilicon layer, so as to leave no stringers, but without removing the silicon oxide layer on the surface of the islands, and without undercutting the sides of the gate lines formed by the etching technique.

SUMMARY OF THE INVENTION

A method of plasma etching a layer which includes polycrystalline silicon and which extends over an island of silicon on a substrate includes coating a portion of the layer with a masking layer; and then subjecting the exposed portion of the layer to a gaseous mixture of nitrogen, chlorine and chloroform while passing a current through the gas to create a plasma to etch away the exposed portion of the layer and coat the exposed walls of the remaining portion of the layer with a thin layer of a polymer. The device is then subjected to a gaseous mixture of an inert gas, chlorine and a gas containing oxygen and carbon while passing a current through the gas to create a plasma to etch away any of the layer which may remain on the side walls of the island as stringers.

DETAILED DESCRIPTION OF PREFERRED EMBODIMENT

Figure 1:
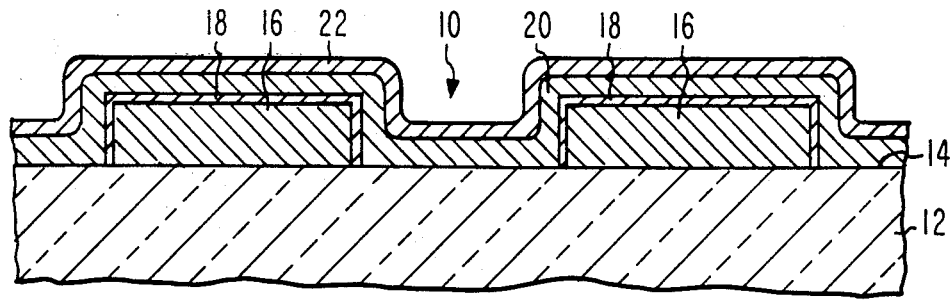
FIG. 1 is a sectional view showing the starting structure of a SOI integrated circuit for which the method of the present invention will be used.

Referring initially to FIG. 1, the method of the present invention begins with a device, generally designated as 10, which includes a substrate 12 of an electrically insulating material, such as sapphire, having on a surface 14 thereof a plurality of islands 16 of single crystalline silicon. The slands 16 are of a thickness of between 0.3 $\mu$m and 0.6 $\mu$m. As is well known in the field of SOI semiconductor technology, the silicon islands 16 are formed by epitaxially depositing a layer of single crystalline silicon on the substrate surface 14, and, using standard photolithographic techniques and etching, defining the silicon layer into islands 16. A thin layer 18 of silicon oxide covers the surface of the islands 16. This may be achieved by heating the device 10 in an oxidizing atmosphere to grow the silicon oxide layer 18. A relatively thick layer 20, about 0.3 $\mu$m in thickness, of doped polycrystalline silicon, polysilcion, is deposited over the silicon oxide layer 18 and the exposed area of the substrate surface 14. The polysilicon layer 20 is generally deposited by chemical vapor deposition techniques which includes exposing the device 10 to an atmosphere of silane which is heated to a temperatue which forms the polycrystalline silicon that deposits on the device. The polysilicon layer 20 may be doped as it is deposited by including a suitable dopant gas in the silane, or doped after being deposited as by subjecting the polysilicon to a dopant such as POCl₃, which dopes the polysilicon with phosphorus. A layer 22 of a metal silicide may be coated over the polysilicon layer 20. This may be achieved by co-sputtering the metal and silicon onto the polysilicon layer 20, or by merely sputtering the metal onto the polysilicon layer 20 and heating the device 10 to convert a portion of the surface of the polysilicon layer 20 to the silicide layer 22. This provides a bilayer polycide 23.

Figure 2:
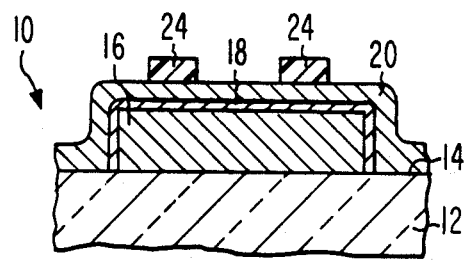
FIG. 2 is a sectional view illustrating the first step in the method of the present invention.

As shown in FIG. 2, a layer 24 of a photoresist is coated on the polycide layer 23, and, using standard photolithographic techniques, is defined to form masking areas which cover the area of the polycide layer 23 which is to form the gate lines. The exposed area of the silicide layer 22 and the underlying polysilicon layer 20 are then subjected to a two step plasma etch process according to the present invention. The two steps are carried out in a standard plasma etching apparatus wherein the device 10 is placed in a chamber between two electrodes with means for controlling the pressure in the chamber and for providing a flow of the desired etching gases through the chamber.

The first step of the etching process includes providing in the chamber a flow of nitrogen ($N_2$). chlorine ($Cl_2$) and chloroform ($CHCl_3$) at a pressure of about 125 mtorr. The electrodes are connected across a source of electrical current at a power of about 500 watts. Suitably, the gases are present in the amount by volume of 1 part of nitrogen, 2 parts of chlorine and 1 part of chloroform. Preferably, the gases are present in the amount of 10 sccm of nitrogen, 20 sccm of chlorine and 10 sccm of chloroform. Each of the constituents of the gaseous mixture performs a specific function. The chlorine is the main etchant and serves to etch away the exposed area of the silicide and underlying polysilicon. The chloroform produces a polymer which coats the side walls of the strips of the polycide which are covered by the resist masking layer 24. At the same time, the chloroform produces chlorine which assists in the etching. The nitrogen acts as a diluent. Attempts to remove the nitrogen or replace it with helium did not give good etching results.

Figure 3:
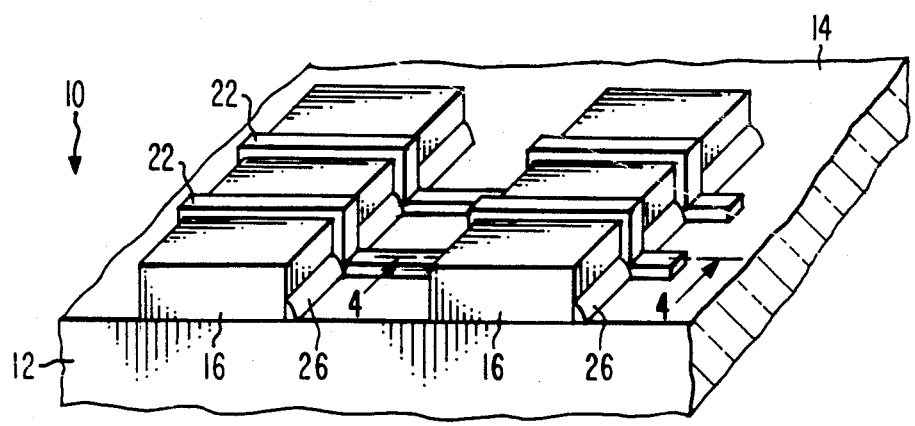
FIG. 3 is a perspective view of the device after the first etching step.
Figure 4:
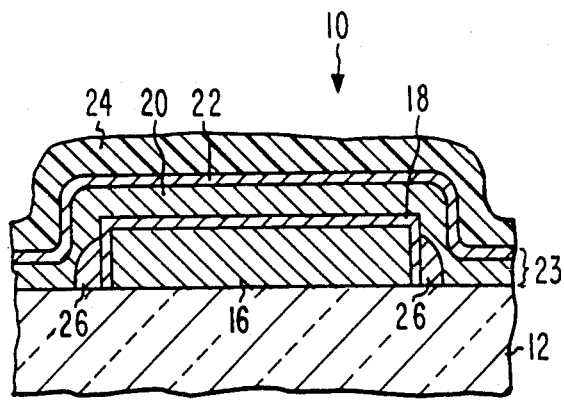
FIG. 4 is a sectional view taken along line 4—4 of FIG. 3.

The above etchant is an anisotropic etch which etches straight down to provide the polycide gate lines 24 formed under the resist masking area 22 (see FIG. 3) with vertical side walls. However, the polysilicon layer 20, with or without the silicide layer 22, is thicker in a direction normal to the substrate surface along the side walls of the silicon islands 16 than over the top surface of the islands 16 and over the substrate surface 14. Therefore, when the polycide layer 23 has been etched down to the silicon oxide layer 18 and to the substrate surface 14, stringers 26 of the polysilicon remain along the side walls of the silicon islands 16. The next step in the method of the present invention is to remove the stringers 26 without undercutting the polycide gate lines 24 or removing any of the exposed area of the silicon oxide layers 18.

The stringers 26 are removed by placing the device 10 in the plasma etching chamber and passing through the chamber a gaseous mixture of helium, chlorine and carbon dioxide at a pressure of about 100 mtorr. The gases are present in the amount by volume of 1.5 parts of helium, 4 parts of chlorine and 1 part of carbon dioxide. Preferably, the gases are present in the amount of 15 sccm of helium, 40 sccm of chlotine and 10 sccm of carbon dioide. If desired, the helium may be replaced with another inert gas, such as argon. The electrodes are connected across a source of current at a power of 225 watts to create a plasma in the chamber.

Figure 5:
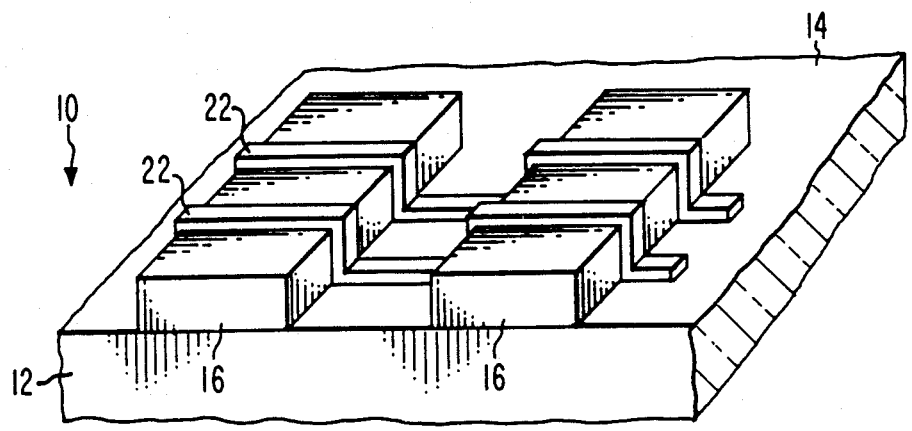
FIG. 5 is a perspective view of the device after the second etching step of the present invention.

The gases used, as in the first step, each performs a particular function. The chlorine, as in the first step, is the main etchant to etch away the polysilicon of the stringers 26. However, the sides of the gate lines 24 are not undercut since they are protected from the chlorine by the polymer coating applied thereon during the first step. The carbon dioxide provides oxygen which maintains the silicon oxide layer 18 on the islands 16. The carbon dioxide also provides carbon which helps maintain the polymer on the side walls of the gate lines 24. The helium increases the DC bias and improves the plasma efficiency. Thus, as shown in FIG. 5, the second step of the etching process of the present invention removes any stringers 26 so that the gate lines 24 are not electrically connected together. This is achieved without undercutting the gate line 24, and without removing the silicon oxide layer 18 on the surface of the silicon islands 16.

Thus, there is provided by the present invention a method of anisotropically etching with a plasma etch a layer of polysilicon, which may be coated with a layer of a silicide, to form narrow gate lines for short gate lengths, 1.25 µm down to submicron length. The method etches the polysilicon while eliminating stringers which may be formed between the gate lines, without undercutting the gate lines and without removing the silicon oxide layer on the surface of the silicon islands.

We claim:

1. A method of plasma etching a layer which includes polycrystalline silicon and which extends over an island of silicon on a substrate, said method comprising the steps of:
   (a) covering a portion of said layer with a masking layer;
   (b) subjecting the exposed portion of the layer to a gaseous mixture of nitrogen, chlorine and chloroform while passing a current through the gas to create a plasma so as to etch away the exposed portion of the layer and coat the exposed walls of the remaining portion of the layer with a thin polymer layer; and then
   (c) subjecting the polycrystalline layer to a gaseous mixture of an inert gas, chlorine and a gas containing oxygen and carbon while passing a current through the gas to create a plasma so as to etch away any stringers of the layer which may remain on the side walls of the island.

2. A method in accordance with claim 1 wherein in step (b) the gases are present in the amount of by volume of 1 part of nitrogen, 2 parts of chlorine and 1 part of chloroform.

3. A method in accordance with claim 2 in which in step (c) the gases are present in the amount by volume of 1.5 parts of the inert gas, 4 parts of chlorine and 1 part of the gas containing oxygen and carbon.

4. A method in accordance with claim 3 in which the inert gas is helium and the gas containing oxygen and carbon is carbon dioxide.

5. A method in accordance with claim 4 in which the gases in step (b) are present in the amount of 10 sccm of nitrogen, 20 sccm of chlorine and 10 sccm of chloroform, and the gases in step (c) are present in the amount of 1.5 sccm of helium, 40 sccm of chlorine and 10 sccm of carbon dioxide.

6. A method in accordance with claim 5 in which in step (b) the gases are at a pressure of about 125 mtorr and a current at a power of about 500 watts is placed across the gases to create the plasma.

7. A method in accordance with claim 6 in which in step (c) the gases are at a pressure of about 100 mtorr and a current at a power of about 225 watts is placed across the gases to create the plasma.

8. A method of forming on a semiconductor device gate lines of polycrystalline silicon over an island of single crystalline silicon on an insulating substrate and covered with a thin layer of silicon oxide comprising the steps of:

(a) forming a layer of polycrystalline silicon over the silicon oxide layer and the adjacent area of the substrate surface;
(b) forming masking strips over the areas of the polycrystalline silicon layer which are to form the gate lines;
(c) subjecting the polycrystalline silicon layer to a first etch wherein the polycrystalline silicon layer is exposed to a gaseous mixture of nitrogen, chlorine and chloroform with a current placed across the gases to create a plasma to etch away the exposed area of the polycrystalline silicon layer to the silicon oxide layer and the surface of the substrate while applying a coating of a polymer on the side walls of the gate lines under the masking strips; and then
(d) subjecting the device to a second etch of a gaseous mixture of an inert gas, chlorine and a gas containing oxygen and carbon with a current placed across the gases to create a plasma so as to etch away any stringers of the polycrystalline silicon extending along the side walls of the island between the gate lines.

9. A method in accordance with claim 8 wherein in step (c) the gases are present in the amount of by volume 1 part of nitrogen, 2 parts of chlorine and 1 part of chloroform.

10. A method in accordance with claim 9 in which in step (d) the gases are present in the amount by volume of 1.5 parts of the inert gas, 4 parts of chlorine and 1 part of the gas containing oxygen and carbon.

11. A method in accordance with claim 10 in which the inert gas is helium and the gas containing oxygen and carbon is carbon dioxide 12. A method in accordance with claim 11 in which the gases in step (c) are present in the amount of 10 sccm of nitrogen, 20 sccm of chlorine and 10 sccm of chloroform, and the gases in step (d) are present in the amount of 1.5 sccm of helium, 40 sccm of chlorine and 10 sccm of carbon dioxide.

13. A method in accordance with claim 12 in which in step (c) the gases are at a pressure of about 125 mtorr and a current at a power of about 500 watts is placed across the gases to create a plasma.

14. A method in accordance with claim 13 in which in step (d) the gases are at a pressure of about 100 mtorr and a current at a power of about 225 volts is placed across the gases to create a plasma.

15. A method in accordance with claim 14 including before step (b) applying a layer of a metal silicide over the polycrystalline silicon layer.

* * * * *